(12) United States Patent
Mitric et al.

(10) Patent No.: US 10,007,639 B2
(45) Date of Patent: Jun. 26, 2018

(54) PLL SYSTEM WITH MASTER AND SLAVE DEVICES

(71) Applicant: Microsemi Semiconductor ULC, Kanata (CA)

(72) Inventors: Krste Mitric, Ottawa (CA); Slobodan Milijevic, Ottawa (CA); Wenbao Wang, Ottawa (CA); Gabriel Rusaneanu, Ottawa (CA)

(73) Assignee: Microsemi Semiconductor ULC, Kanata, ON (CA)

( * ) Notice: Subject to any disclaimer, the term of this patent is extended or adjusted under 35 U.S.C. 154(b) by 150 days.

(21) Appl. No.: 15/090,637

(22) Filed: Apr. 5, 2016

(65) Prior Publication Data
US 2016/0299870 A1   Oct. 13, 2016

Related U.S. Application Data

(60) Provisional application No. 62/144,593, filed on Apr. 8, 2015.

(51) Int. Cl.
| | | |
|---|---|---|
| *G06F 13/00* | (2006.01) | |
| *G06F 13/42* | (2006.01) | |
| *G06F 13/364* | (2006.01) | |
| *G06F 1/08* | (2006.01) | |

(52) U.S. Cl.
CPC ............ *G06F 13/4291* (2013.01); *G06F 1/08* (2013.01); *G06F 13/364* (2013.01)

(58) Field of Classification Search
CPC ....... G06F 13/4291; G06F 1/08; G06F 13/364
See application file for complete search history.

(56) References Cited

U.S. PATENT DOCUMENTS

| | | | | |
|---|---|---|---|---|
| 4,305,045 A | * | 12/1981 | Metz ......................... | H03L 7/07 331/1 A |
| 5,477,177 A | * | 12/1995 | Wong ....................... | H03L 7/085 327/156 |
| 9,369,370 B2 | * | 6/2016 | Chow .................... | H04L 41/083 |
| 2006/0056563 A1 | * | 3/2006 | Aweya ................. | H03D 13/002 375/376 |
| 2009/0168843 A1 | * | 7/2009 | Waters .................... | G01S 19/34 375/130 |
| 2010/0111113 A1 | * | 5/2010 | Wong .................... | H04J 3/0664 370/503 |

(Continued)

OTHER PUBLICATIONS

"Phase-locked loop"—Wikipedia, retrieved from https://en.wikipedia.org/wiki/Phase-locked_loop.*

*Primary Examiner* — Jing-Yih Shyu
(74) *Attorney, Agent, or Firm* — Simon Kahn

(57) ABSTRACT

A master phase locked loop device is operable in association with one or more slave devices including slave digitally controlled oscillators (sDCOs), one or more digital PLL (DPLL) channels include a master digitally controlled oscillator (mDCO). A master synchronization timer generating master timing pulses to read phase and frequency information from the mDCO(s). A peripheral interface sends the read frequency and phase information to the one or more slave devices. A synchronization interface sends the master timing pulses to synchronize a replica synchronization timer in the sDCO(s) that generates slave timing pulses for use in updating the phase and frequency information received at the slave device(s).

20 Claims, 3 Drawing Sheets

(56) References Cited

U.S. PATENT DOCUMENTS

2014/0177681 A1* 6/2014 Chung ................ H04B 1/7097
375/146
2015/0061779 A1* 3/2015 Kim .......................... H03L 1/00
331/25

* cited by examiner

PLL SYSTEM WITH MASTER AND SLAVE DEVICES

CROSS REFERENCE TO RELATED APPLICATIONS

This application claims the benefit under 35 USC 119 (e) of U.S. provisional application No. 62/144,593, filed Apr. 8, 2015, the contents of which are herein incorporated by reference.

FIELD OF THE INVENTION

This invention relates to the field of precision timing, and in particular to accurate phase and frequency control in a digital phase locked loop (PLL) system including a master PLL device and one or more slave devices.

BACKGROUND OF THE INVENTION

Demand on the global market for higher integration motivates the requirement for high count multi-channel synchronization devices, mainly PLLs. Different applications require a different number of channels. Using devices with more than the required number of channels is often the case, with obvious cost disadvantage. Distributing functions over one master device and multiple slave devices is an option, but it is not one that can be widely used due to lack of good synchronization, which requires lots of feedback connection clocks from each slave device to the master device.

One prior art solution uses a high integration multi-channel PLL device that can manage the highest demand for number of channels often over 10 to cover applications that do not require as many channels. The requirement for high silicon and board area makes this solution less and less attractive. Another prior art solution employs devices with a small number of PLL channels to cover all required applications. The disadvantages of this solution are technical difficulties of proper synchronization and output clock alignment among the used PLL devices, as well as overhead of complex digital PLL functions in each device, which usually equates to a higher price.

Another solution builds an entire portfolio of multi-channel PLL devices with all the required possible channel counts. The cost disadvantage of this option is evident.

Yet another solution uses a master-slave concept of dispersing area intensive and performance critical functions into slave devices. The problem with this prior solution was lack of a good synchronization method, which assumed the use of an external feedback concept similar to a numerically controlled oscillator (NCO), where frequency and phase errors were corrected by feedback clocks from slave devices to the master device. As a result the design is too complex, and uses too many resources in form of pins on the master device and slave devices, as well as other slave resources such as output dividers.

The use of a master-slave concept with direct control of the slaves by the master has also been tried, but this involves strict timing closure requirements that are impractical or impossible to implement in multi-chip or even a multi-die environment.

SUMMARY OF THE INVENTION

Embodiments of the invention make it possible to create flexible multi-channel PLL, in particular a multi-channel digital phase locked loop (DPLL) using one master device to accurately control frequency and phase of multiple slave devices. Embodiments of the invention address the issue of the granularity of multi-channel PLL devices by providing a novel synchronization method to the prior art master-slave concept. This allows support for a flexible architecture that is based on a 'building block on-demand' concept, where complex functions usually implemented in the digital logic reside on one device, while a frequency synthesis engine can be sitting on multiple slave devices in same or different package, allowing precise and proper control of the slave devices by the master device, without need for using external feedback.

According to the present invention there is provided a master phase locked loop (PLL) device operable in association with one or more slave devices including slave digitally controlled oscillators (sDCOs), comprising: at least one digital PLL (DPLL) channel, each including a master digitally controlled oscillator (mDCO) having a higher resolution than said slave digitally controlled oscillators; a master synchronization timer for generating master timing pulses to permit reading phase and frequency information from said mDCO(s); a peripheral interface for sending said read frequency and phase information to said one or more slave devices; and a master synchronization interface for sending said master timing pulses to synchronize a replica synchronization timer in said sDCO(s) that generates slave timing pulses for use in updating said phase and frequency information received at said slave device(s).

Preferably the master PLL device is a multi-channel device, each channel comprising a phase locked loop including a mDCO.

Synchronization challenges that arise when creating a flexible number of PLL channels depending on application are addressed by separating the core digital phase locked loop DPLL functions from the frequency synthesis functions into separate devices. In most cases, depending on required PLL performance, implementation of the frequency synthesis function is analog-intensive and requires large die area, while DPLL functions are usually realizable in digital logic that is scalable with the silicon technology. The main challenge lies in having proper communication between the device carrying DPLL functions and the devices responsible for Frequency synthesis.

The master-slave concept, which is used for similar distribution of functionalities in different applications, allows very flexible creation of any number of PLL channels with minimum or no overhead. In a PLL environment, one master device, capable of accepting required number of reference clocks, can control multiple slave devices. Depending on the application requirements for channel granularity, slave devices can have one, two, or more channels in a single die or package. The ability to properly control all slave devices, by virtue of guaranteeing proper phase and frequency response of the slave devices to changes of the selected reference from the master device, becomes the key for ability to use such system, and good synchronization mechanism is the master key.

Embodiments of the invention use a method of proper synchronization within multi-channel PLL system, between a master device, containing a reference sampling digitizing module and DPLL modules, namely the phase/frequency detector, loop filter and digitally controlled oscillator (DCO), and the slave devices containing mainly a frequency synthesis module that is analog intensive. The control of frequency and phase of the slave devices by the master device is done using a serial interface to minimize the number of interconnection lines between the master and slave devices.

Embodiments of the invention allow good alignment among all output clocks from multiple slave devices as well as alignment between a selected input reference clock and any slave output clock without requiring any physical feedback signal from the slave devices to the master device. In order to achieve the required alignment, besides serial interface connections from the master-to slave devices that are required for frequency and phase control of the slaves, the master device sends the system clock and periodic synchronization signal Sync to every slave device. A synchronization mechanism that allows use of master-slave concept is a feature of this invention. One aspect of the invention is a synchronization method, achieved by using a master device synchronization pulse to determine the average time of frequency and phase update, with a synchronization pulse in each slave that determines the exact time of applying the phase and frequency to a particular slave device.

When very accurate alignment over voltage and temperature variations is required, an additional feedback signal from each slave can be passed to the master device, allowing very accurate alignment among all slave output clocks and between a selected reference clock and any slave output clock.

The synchronization method can be applied to a master-slave based multi channel PLL, whether it is embodied in one package or implemented using one package for Master device and single or multiple packages for slave devices.

According to another aspect of the invention there is provided a method of controlling one or more slave devices including a digitally controlled oscillator (DCO) controlled by an output of a digitally controlled oscillator in a master phase locked loop device, comprising: generating timing pulses in the master device by a master synchronization timer; synchronizing said replica synchronization timer(s) with master timing pulses received from said master device; reading phase and frequency information from said output of said digitally controlled oscillator; transmitting said phase and frequency information to said one or more slave devices over a peripheral interface; and updating said phase and frequency information at said one or more slave devices based on timing pulses generated by said replica synchronization timer(s).

BRIEF DESCRIPTION OF THE DRAWINGS

This invention will now be described in more detail, by way of example only, with reference to the accompanying drawings, in which.

DETAILED DESCRIPTION OF PREFERRED EMBODIMENTS

Figure 1:
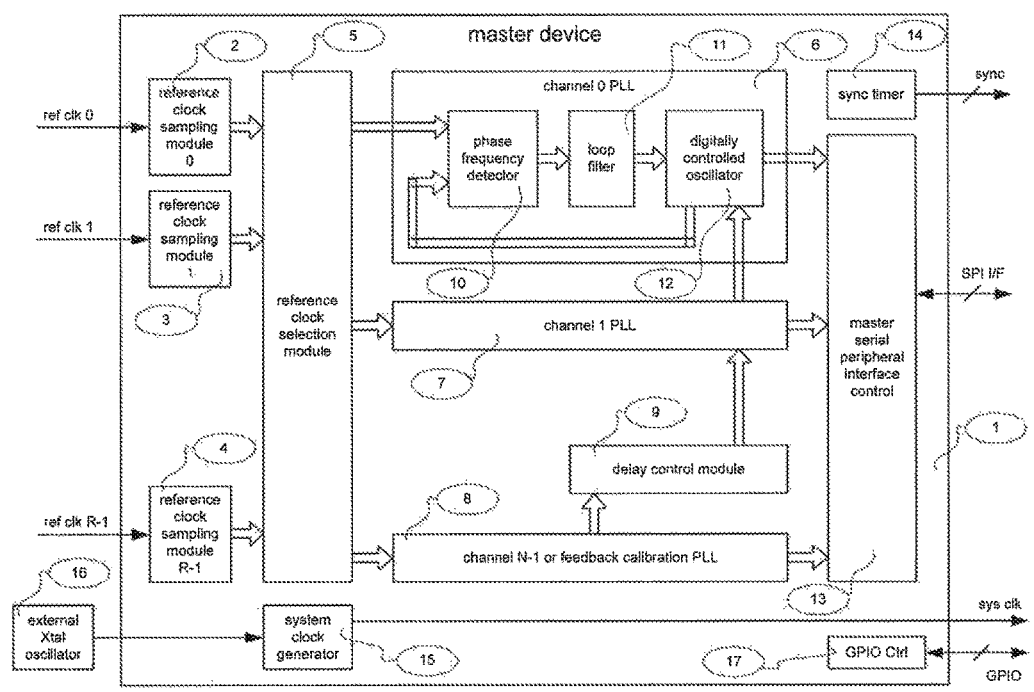
FIG. 1 is a block diagram of a multi-channel master device.
Figure 2:
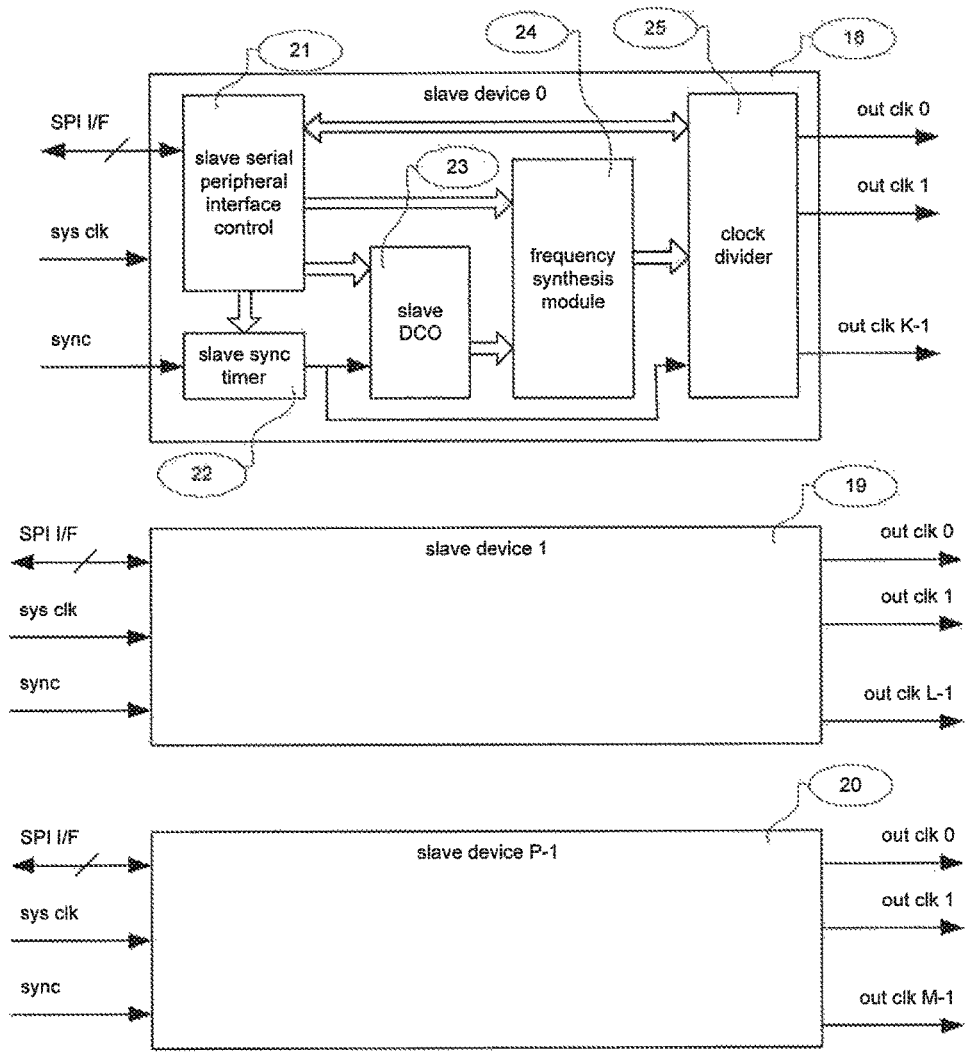
FIG. 2 is a block diagram showing a series of slave devices.

As shown in FIGS. 1 and 2, a multi-channel PLL, using a synchronization method in accordance with an embodiment of this invention, comprises a master device 1 and multiple slave devices, 18, 19, 20. The role of the master device 1 is to accept multiple reference clocks and to allow each channel PLL to track any of the reference clocks, clk 0 ... clk R−1.

Each reference clock is first sampled (digitized) by the corresponding reference clock sampling module 2, 3, 4. The reference clocks are monitored for their quality based on specified reference clock failure criteria, which is application dependent, and an appropriate reference is selected, using reference clock selection module 5 for each of the N PLL channels 6, 7, 8.

Each PLL consists of phase frequency detector 10, loop filter 11 and master digitally controlled oscillator (mDCO) 12. Phase information related to the selected reference is compared with the system clock in the phase frequency detector 10, resulting in a phase error that is passed through low pass loop filter 11 prior to being used as the frequency and phase control word for the mDCO 12.

The system clock is generated by system clock generator module 15, which is fed by stable clock from external crystal oscillator 16.

The mDCOs 12 in the master device have significantly higher resolution than the corresponding sDCOs 23 in the slave devices. For example the mDCOs may have a 96-bit wide resolution whereas the resolution of the sDCOs may be only 40 bits wide.

The master DCO 12 phase and frequency information is periodically provided to the master serial peripheral interface (MSPI) 13 to be used to update targeted slave device sDCO 23. To accommodate proper updating of the slave devices 18, 19, 20, without requiring a massive scheme of feedback clocks from multiple slave devices 18, 19, 20 to the master device 1, which would make entire concept unusable, adequate synchronization between master and slave devices is required.

In order to provide synchronization between the master and slave devices, a master synchronization timer 14 in the master device generates periodic pulses that are used for reading the mDCO 12 phase and frequency information needed by the slave DCOs 23. To avoid the requirement for the synchronization timer 14 pulses to be delivered in one system clock cycle to slave devices 18, 19, 20, each slave device has its own slave synchronization timer 22, which is replica of the master synchronization timer 14. Since the master device supplies the system clock to all slave devices, the master synchronization timer 14 on the master device and slave synchronization timer 22 on each slave device will be run using the same system clock frequency so the synchronization need be performed only during the device initialization. The phase and frequency of the slave DCOs 23 are updated based on pulses from the slave synchronization timer 22.

The main purpose of the channel N−1 PLL 8 is to serve as a feedback calibration PLL when very tight alignment, for example, in the order of +/−0.5 ns, is required. In this case, adjustments to the output clock positions have to be continuous to compensate for any temperature and voltage variations. When such tight alignment is not required, for example, +/−2 ns, the channel N−1 PLL 8 can be used as any regular PLL.

All the output clocks of the slave devices 18, 19, 20 are guaranteed to have the required alignment, among themselves and to the selected reference clock by virtue of correct synchronization between the master device and the slave devices.

Slave serial peripheral interface SSPI control module 21 in each slave device receives data from the MSPI control module 13, creating the required format of data for updating the phase and frequency for the slave DCO 23, as well as static control for frequency synthesis module 24 and clock divider 25.

When feedback calibration is required, one of the reference sources is chosen to accept a feedback clock from all of the slave devices, in turn allowing the accurate control of any slave output clock phase. In one exemplary embodiment, the feedback clock is applied to the input of reference clock sampling module 4, but other sampling modules could be selected. The PLL channel 8 that tracks the feedback clock changes is used to update the mDCO 12 of each PLL 6,7,8 through a delay control module 9.

The mDCOs have to be updated because the slave devices follow their counterpart master clocks. Although one PLL and therefore one master DCO can control multiple, or all the slaves, there is an option for each slave to have its own corresponding PLL in the master device. The role of the PLLs 6 . . . 8 is to follow the reference phase (with desired loop bandwidth and many other parameters) and control timing of all outputs, including the slaves. All adjustments have to be made through the master PLL, and therefore through the master DCO that is part of the master PLL, in order to be passed to its slave(s), including the adjustments to achieve very accurate alignment, calculated based on the feedback clock.

Even though external feedback is used in this case, the resources used are significantly less compared to the prior art where each feedback clock would require a separate pin and processing PLL, including a reference clock sampling module on the master device.

Figure 3:
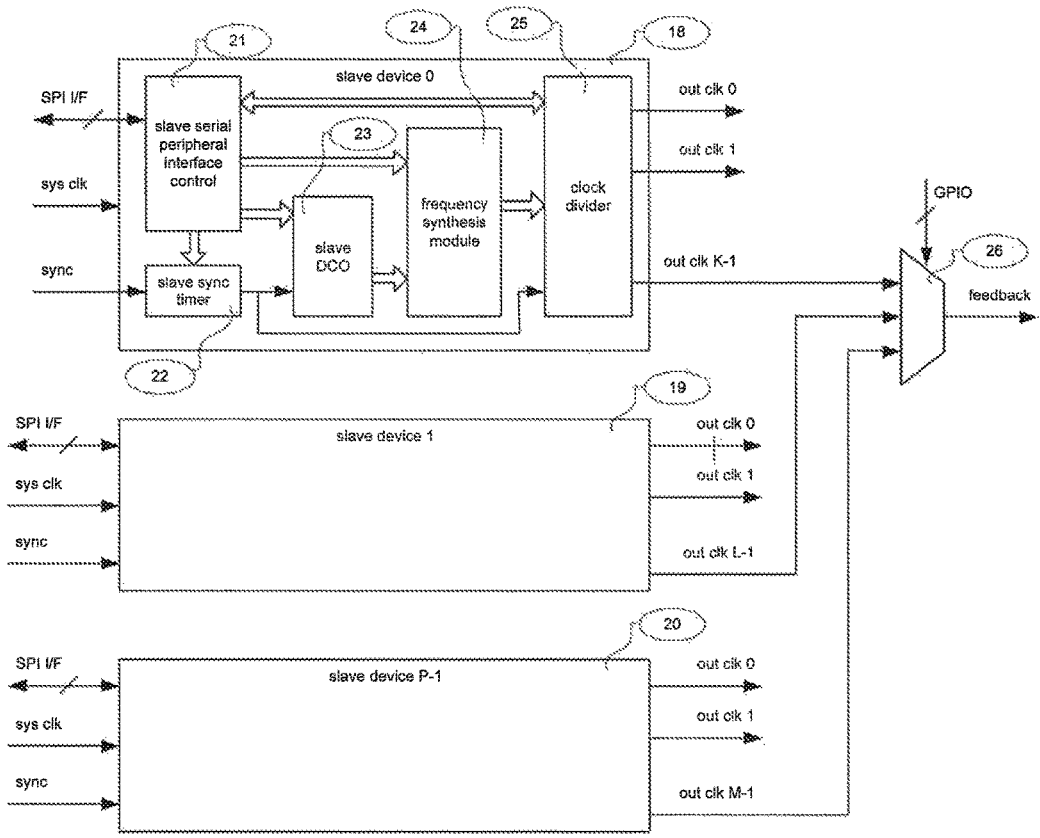
FIG. 3 is a block diagram of multi-channel multiple PLL slave devices requiring feedback to a master device for maintaining accurate alignment.

Referring now to FIG. 3, multiplexer 26 is required to select clocks from each slave device 18, 19, 20 that requires very accurate alignment of output clocks to be maintained over voltage and temperature variations. The multiplexer 26 is controlled by the general purpose Input/Output (GPIO) signals from the master GPIO control module 17 in the master device to periodically select each slave 18, 19, 20 output clock to be monitored for appropriate output clock alignment. In this mode, each slave output clock divider 25 can be individually coarsely adjusted to achieve accurate clock alignment in addition to performing fine adjustment of each slave DCO 23 through the master DCO 12. The channel N−1 or feedback calibration PLL 8 is used as the feedback calibration PLL that controls output clock phase through the delay control module 9 by updating the slave DCO 23 and slave clock divider 25.

One of the key elements in the multi-channel PLL with the master-slave concept is proper communication between the master device and slave devices. Conceptually, one of the easiest ways of performing master-slave communication is to ensure direct timing control of the slave devices by the master device, which requires strict timing control from the master to the slaves. A disadvantage of this method is the requirement for system clock alignment between the master and slaves.

In order to ease the timing closure requirement, a different synchronization scheme is implemented in the preferred embodiment. The synchronization method also takes advantage of the existence of physical calibration feedback lines between each slave device and the master device for cases where very accurate alignment among the output clocks is required to be tracked over voltage and temperature variations. The synchronization scheme requires proper synchronization between the master synchronization timer 14 and the slave synchronization timer 22.

Figure 4:
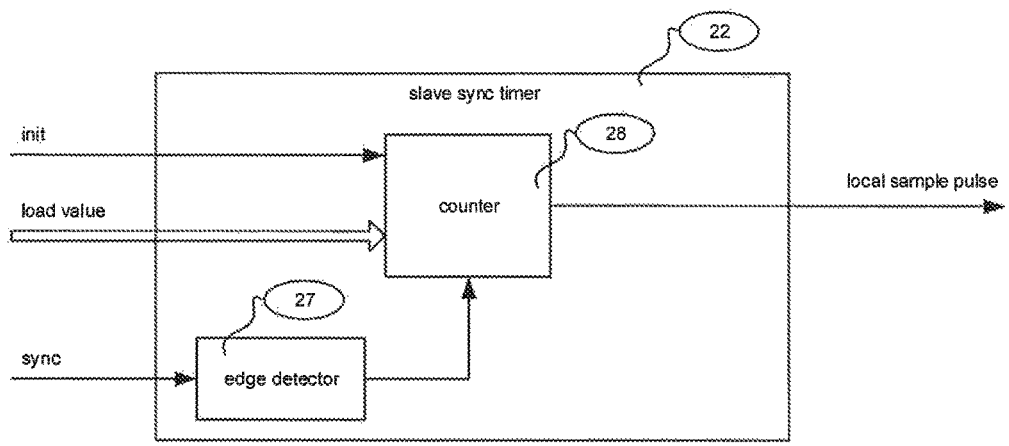
FIG. 4 is a block diagram of a slave synchronization timer.

A block diagram of the slave synchronization timer 22 is shown in FIG. 4. The master device 1 generates a sampling pulse that is sent to every slave device 18, 19, 20. Each slave synchronization timer 22 has an edge detector 27 to define the rising edge of the pulse as the alignment point.

Each slave synchronization timer 22 has its own counter 28 that is reprogrammed by the master device 1 whenever the master synchronization timer 14 count value is changed. To ensure proper synchronization it is important that the master synchronization timer 14 is changed first, before the synchronization timers 22 in the slave devices 18, 19, 20 are changed.

Upon power up, or after either the master synchronization timer 14 or slave synchronization timer 22 initial count value changes, the synchronization of the slave synchronization timer 22 is performed. The output clocks are disabled during synchronization to avoid phase jumps.

The counter 28 of the slave synchronization timer 22 is overwritten by a previously written specified value, or a default value upon power up at the moment when the synchronization pulse coming from the master device 1 is detected. This overwriting will happen only once or couple of times (programmable during initialization), and then the counter 28 of the slave synchronization timer 22 will continue counting on its own without re-synchronization required to generate local sample pulses. The synchronization pulse from the master device 1 does not need to meet any specific timing relative to the local slave system clock. The pulse is assumed to be wide enough such that edge detection with the system dock can be always performed correctly.

The values of the master synchronization timer 14 and slave synchronization timers 22 cannot be guaranteed to be the same because the synchronization pulse is not required to be related to the slave system clock. Therefore, other mechanisms of output phase control, which assume phase offset rather than absolute phase update, are employed. There is an uncertainty in-between master sync pulse and slave sync pulses (IO delays, clock trees in two different devices).

The coarse alignment, input to output and output to output alignment, is performed by providing reset and phase adjustment to the slave DCO 23 and clock divider 25 through the offset control mechanism based on a virtual timing reference inside the master device DCO 12. The master device can predict mathematically where each slave output clock has to be since the slave DCO is kept in sync to master DCO.

Embodiments of the invention provide a flexible multi-channel PLL consisting of one master device that controls frequency and phase of multiple slave devices using a novel synchronization mechanism that allows precise phase and frequency control of the slave devices without using external feedback and additional resources that would otherwise be required for external feedback control. Time division multiplexing may be used concept to sequentially update phase and frequency of the slave devices by periodically dedicating time slot for each slave device to be updated.

A simple serial interface allows for updating phase and frequency information from the master device to the slave devices. The phase may be aligned among output clock from all the slave devices without using a feedback dock from the slave devices to the master device.

Uncertainty in output clocks to input references alignment, caused by delay variation between master sync signal coming out of the master device 1 and local sample pulses inside every slave device 18, 19, 20 can be minimized by reading current state of every slave clock divider 25 at local sample pulse instance, and passing the counter state through slave serial peripheral interface control 21 to master serial peripheral interface control module. The master device 1 can use this information to correct phase of the output clocks by controlling slave DCO 23 or clock divider 25.

It should be appreciated by those skilled in the art that any block diagrams herein represent conceptual views of illustrative circuitry embodying the principles of the invention. For example, a processor may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" should not be construed to refer exclusively to hardware capable of executing software, and may implicitly include, without limitation, digital signal processor DSP hardware, network processor, application specific integrated circuit ASIC, field programmable gate array FPGA, read only memory ROM for storing software, random access memory RAM, and non volatile storage. Other hardware, conventional and/or custom, may also be included. The functional blocks or modules illustrated herein may in practice be implemented in hardware or software running on a suitable processor.

The invention claimed is:

1. A master phase locked loop device arranged for operation in association with one or more slave devices each comprising a respective slave digitally controlled oscillator (sDCO), the master phase locked loop device comprising:
   at least one digital PLL (DPLL) channel, each including a master digitally controlled oscillator (mDCO) having a higher resolution than said respective DCOs of the one or more slave devices;
   a master synchronization timer for generating master timing pulses to permit reading phase and frequency information from said mDCO;
   a peripheral interface for sending said read phase and frequency information to said one or more slave devices; and
   a master synchronization interface for sending said master timing pulses to synchronize a respective replica synchronization timer in each of said one or more slave devices, the respective replica synchronization timer arranged to generate slave timing pulses for use in updating the respective sDCO of the respective slave device with said read phase and frequency information received at the respective slave device.

2. The master phase locked loop device as claimed in claim 1, wherein said peripheral interface is a serial interface.

3. The master phase locked loop device as claimed in claim 1, further comprising a multiplexer for selecting one of a plurality of reference clocks for input to said at least one DPLL channel.

4. The master phase locked loop device as claimed in claim 1, wherein the at least one DPLL channel is one of a plurality of DPLL channels.

5. The master phase locked loop device as claimed in claim 4, wherein a selected one of the plurality of DPLL channels is designated as a feedback calibration channel and is responsive to a feedback signal from a selected one of said one or more slave devices to effect fine adjustment of the respective sDCO included in said selected slave device.

6. The master phase locked loop device as claimed in claim 5, further comprising a delay control module responsive to the feedback signal to update the mDCO of the other DPLL channels in the master phase locked loop device.

7. The master phase locked loop device as claimed in claim 6, further comprising a multiplexer responsive to selection signals to select a slave output clock from said selected slave device for input to said feedback calibration channel.

8. The master phase locked loop device as claimed in claim 7, wherein said multiplexer is configured to select the slave output clock from said one or more slave devices in turn in a time division multiplexed manner.

9. The master phase locked loop device as claimed in claim 7, further comprising a general purpose input/output (GPIO) controller operative to send said selection signals to said multiplexer.

10. The master phase locked loop device as claimed in claim 1, wherein said master synchronization interface generates said master timing pulses with a width that is wide enough to guarantee correct sampling by said one or more slave devices.

11. A slave device operating in association with a master phase locked loop (PLL) device and running on a system clock generated in said master PLL device, comprising:
    a slave digitally controlled oscillator controlled by phase and frequency information obtained from the master PLL device; and
    a replica synchronization timer for generating replica timing pulses to permit reading of the phase and frequency information received from the master PLL device, said replica synchronization timer being responsive to timing pulses received from the master PLL device to synchronize said replica synchronization timer with a master synchronization timer in the master PLL device.

12. The slave device as claimed in claim 11, further comprising a peripheral interface for receiving said phase and frequency information from the master PLL device.

13. The slave device as claimed in claim 11, further comprising an edge detector for detecting an edge of the timing pulses received from the master PLL device to define an alignment point for synchronizing said replica synchronization timer with said master synchronization timer.

14. A method of controlling one or more slave devices each including a respective first digitally controlled oscillator (DCO) controlled by an output of a second DCO in a master phase locked loop device, comprising:
    generating timing pulses in the master phase locked loop device by a master synchronization timer;
    synchronizing at least one replica synchronization timer with master timing pulses received from said master phase locked loop device;
    reading phase and frequency information from said output of said second DCO;
    transmitting said read phase and frequency information to said one or more slave devices over a peripheral interface; and
    updating the first DCO in the respective slave device of the one or more slave devices with said transmitted phase and frequency information based on timing pulses generated by said at least one replica synchronization timer.

15. The method as claimed in claim 14, wherein said synchronizing occurs upon initialization or whenever a count value in the master synchronization timer is changed.

16. The method as claimed in claim 14, wherein said master timing pulses have a width that is wide enough to guarantee correct sampling by said one or more slave devices.

17. The method as claimed in claim 14, wherein the master phase locked loop device comprises a plurality of phase locked loop (PLL) channels, each PLL channel including a respective DCO, and a selected one of said PLL channels is designated as a feedback channel, the method further comprising sending a feedback signal from a selected one of the slave devices to said feedback channel to develop a fine alignment value for transmission to said selected one of the slave devices.

18. The method as claimed in claim 17, further comprising updating the respective DCO of the non-selected one or more PLL channels based on said feedback signal.

19. The method as claimed in claim 17, wherein said one or more slave devices are selected in turn based on a feedback signal.

20. A system comprising:
  a master phase locked loop device working in association with one or more slave devices including at least one slave digitally controlled oscillator (sDCO), the master PLL device comprising:
    at least one digital PLL (DPLL) channel including a master digitally controlled oscillator (mDCO) having a higher resolution than said at least one sDCO;
    a master synchronization timer for generating master timing pulses to permit reading phase and frequency information from said mDCO;
    a peripheral interface for sending said read frequency and phase information to said one or more slave devices; and
    a master synchronization interface for sending said master timing pulses to synchronize a replica synchronization timer in said at least one sDCO that generates slave timing pulses for use in updating said phase and frequency information received at said one or more slave devices;
  wherein said one or more slave devices, comprise:
    a slave digitally controlled oscillator controlled by phase and frequency information obtained from the master PLL device; and
    a replica synchronization timer for generating replica timing pulses to permit reading of phase and frequency information received from the master PLL device, said replica synchronization timer being responsive to timing pulses received from the master PLL device to synchronize said replica synchronization timer with said synchronization timer in the master device.

* * * * *